United States Patent
White et al.

(10) Patent No.: US 7,256,654 B2
(45) Date of Patent: Aug. 14, 2007

(54) AMPLIFYING A SIGNAL USING A CURRENT SHARED POWER AMPLIFIER

(75) Inventors: Mikel J. White, Murphy, TX (US); Scott M. Heston, Dallas, TX (US); John G. Heston, Murphy, TX (US)

(73) Assignee: Raytheon Company, Waltham, MA (US)

( * ) Notice: Subject to any disclaimer, the term of this patent is extended or adjusted under 35 U.S.C. 154(b) by 168 days.

(21) Appl. No.: 11/104,777

(22) Filed: Apr. 12, 2005

(65) Prior Publication Data

US 2006/0226902 A1 Oct. 12, 2006

(51) Int. Cl.
*H03F 3/68* (2006.01)

(52) U.S. Cl. .................... 330/310; 330/133
(58) Field of Classification Search ............ 330/133, 330/98, 150, 310
See application file for complete search history.

(56) References Cited

U.S. PATENT DOCUMENTS

| | | | | |
|---|---|---|---|---|
| 4,901,032 | A | 2/1990 | Komiak | 330/277 |
| 5,376,900 | A | 12/1994 | Debroux | 330/271 |
| 5,808,501 | A | 9/1998 | Ivanov | 327/333 |
| 5,808,511 | A | 9/1998 | Kobayashi | 330/149 |
| 5,874,858 | A | 2/1999 | Furuya | 330/273 |
| 5,963,092 | A | 10/1999 | Van Zalinge | 330/252 |
| 6,320,462 | B1 | 11/2001 | Alley | 330/124 R |
| 6,753,735 | B2* | 6/2004 | Arai et al. | 330/297 |
| 6,864,742 | B2 | 3/2005 | Kobayashi | 330/124 R |
| 2003/0214358 | A1* | 11/2003 | Yamamoto | 330/310 |

FOREIGN PATENT DOCUMENTS

| | | |
|---|---|---|
| DE | 40 03 462 A1 | 10/1990 |
| DE | 196 16 443 A1 | 10/1997 |
| EP | 0 394 807 A2 | 10/1990 |
| EP | 0 963 038 A2 | 12/1999 |

OTHER PUBLICATIONS

PCT Invitation to Pay Additional Fees (PCT Article 17(3)(a) and Rule 40.1), Annex to Form PCT/ISA/206 Communication Relating to the Results of the Partial International Search regarding PCT/US2006/007522, filed Feb. 3, 2006, Applicant's reference 004578.1547, 8 pages.

* cited by examiner

*Primary Examiner*—Robert Pascal
*Assistant Examiner*—Alan Wong
(74) *Attorney, Agent, or Firm*—Baker Botts L.L.P.

(57) ABSTRACT

A power amplifier includes amplifier stages. An amplifier stage includes a transistor, and at least one amplifier stage comprises a driver stage. The amplifier stages include a first amplifier stage having a first transistor and associated with a first output power, and a second amplifier stage having a second transistor and associated with a second output power. A current sharing coupling couples the first amplifier stage and the second amplifier stage. The first amplifier stage and the second amplifier stage share a current through the current sharing coupling. The current sharing coupling facilitates scaling of the first output power and the second output power.

14 Claims, 2 Drawing Sheets

AMPLIFYING A SIGNAL USING A CURRENT SHARED POWER AMPLIFIER

GOVERNMENT FUNDING

The U.S. Government may have certain rights in this invention as provided for by the terms of Contract No. (classified) awarded by (classified).

TECHNICAL FIELD

This invention relates generally to the field of power amplifiers and more specifically to amplifying a signal using a current shared power amplifier.

BACKGROUND

A power amplifier includes driver stages, where each driver stage supplies excitation to a next driver stage. Each driver stage consumes power to operate. The power consumed by the driver stages, however, reduces the power added efficiency of the power amplifier.

There are known techniques for improving the power added efficiency of a power amplifier. According to one known technique, the bias point, output matching network, or harmonic terminations of a power amplifier may be adjusted to decrease the DC power of the output stage of the amplifier. Decreasing the output stage DC power by matching to an efficiency load target may increase power added efficiency. According to another technique, the size of the driver stages may be reduced to minimize the power consumed by the driver stages. Minimizing power consumption by the driver stages may increase power added efficiency. Reducing the drive stage size, however, may not work for low output power amplifiers. The input stage for a low output power amplifier may be required to be extremely small, and extremely small stages are difficult to match.

SUMMARY OF THE DISCLOSURE

In accordance with the present invention, disadvantages and problems associated with previous techniques for amplifying a signal may be reduced or eliminated.

According to one embodiment of the present invention, a power amplifier includes amplifier stages. An amplifier stage includes a transistor, and at least one amplifier stage comprises a driver stage. The amplifier stages include a first amplifier stage having a first transistor and associated with a first output power, and a second amplifier stage having a second transistor and associated with a second output power. A current sharing coupling couples the first amplifier stage and the second amplifier stage. The first amplifier stage and the second amplifier stage share a current through the current sharing coupling. The current sharing coupling facilitates scaling of the first output power and the second output power.

Certain embodiments of the invention may provide one or more technical advantages. A technical advantage of one embodiment may be that current may be shared between driver stages of a power amplifier. The output power of each stage may be scaled to control power consumption by the driver stages. The output power scaling may improve the power added efficiency of the power amplifier.

Certain embodiments of the invention may include none, some, or all of the above technical advantages. One or more other technical advantages may be readily apparent to one skilled in the art from the figures, descriptions, and claims included herein.

BRIEF DESCRIPTION OF THE DRAWINGS

For a more complete understanding of the present invention and its features and advantages, reference is now made to the following description, taken in conjunction with the accompanying drawings, in which.

DETAILED DESCRIPTION OF THE DRAWINGS

Figure 1:
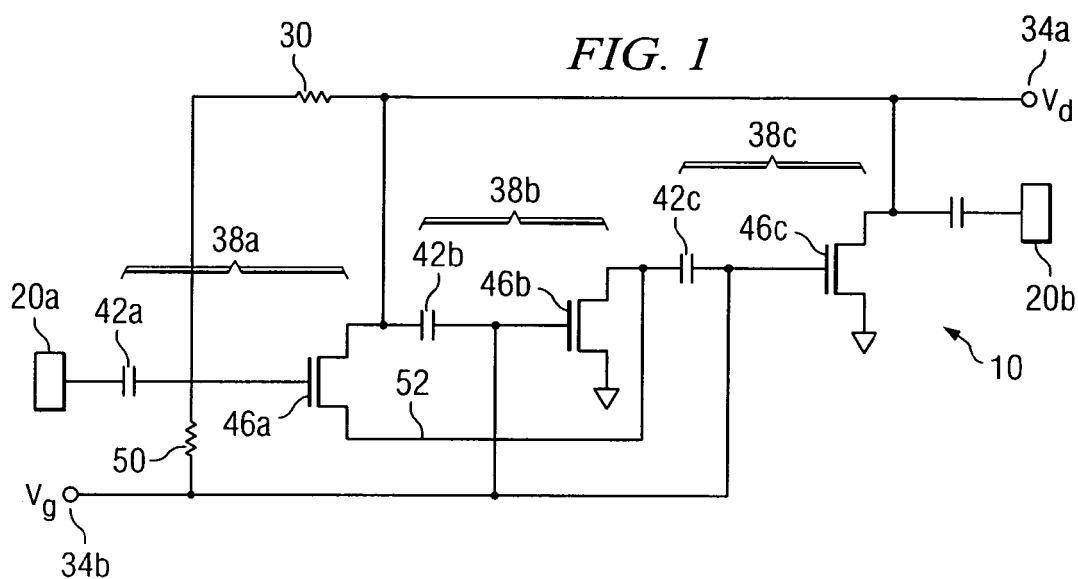
FIG. 1 is a circuit diagram of one embodiment of a power amplifier that may be used to amplify a signal.
Figure 3:
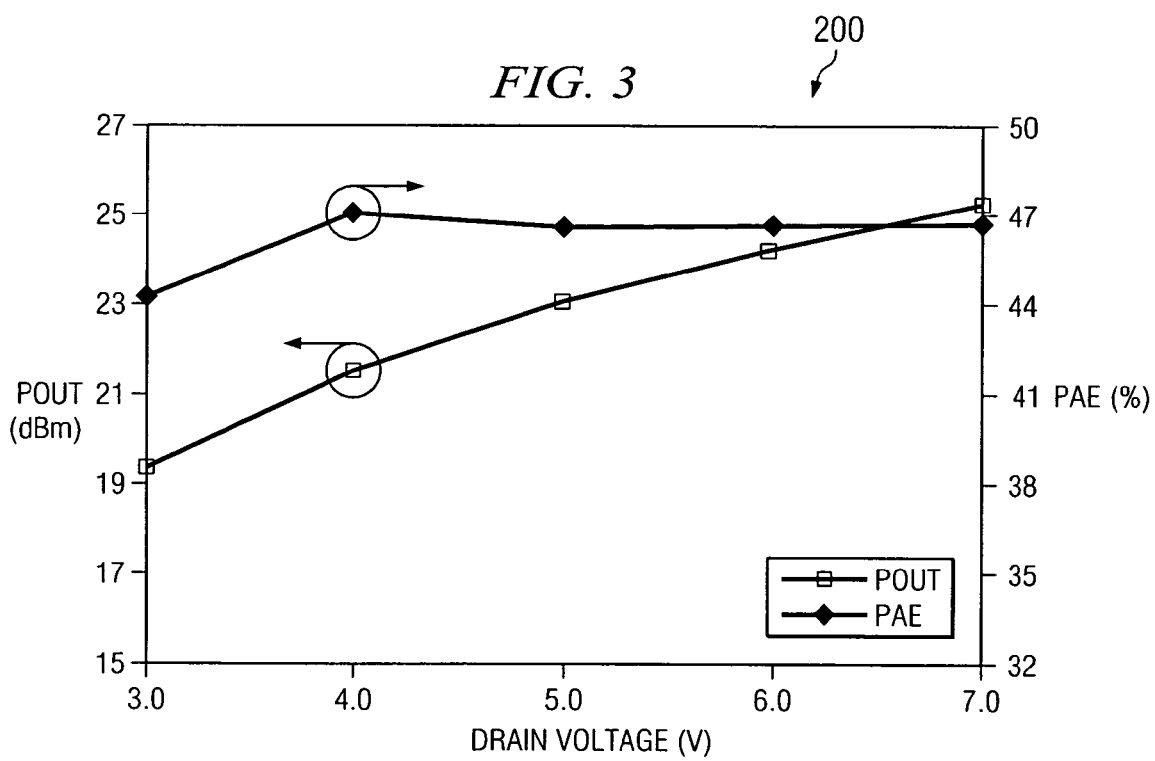
FIG. 3 is a graph illustrating the driver performance over voltage of an example power amplifier of the embodiment of FIG. 1.
Figure 2:
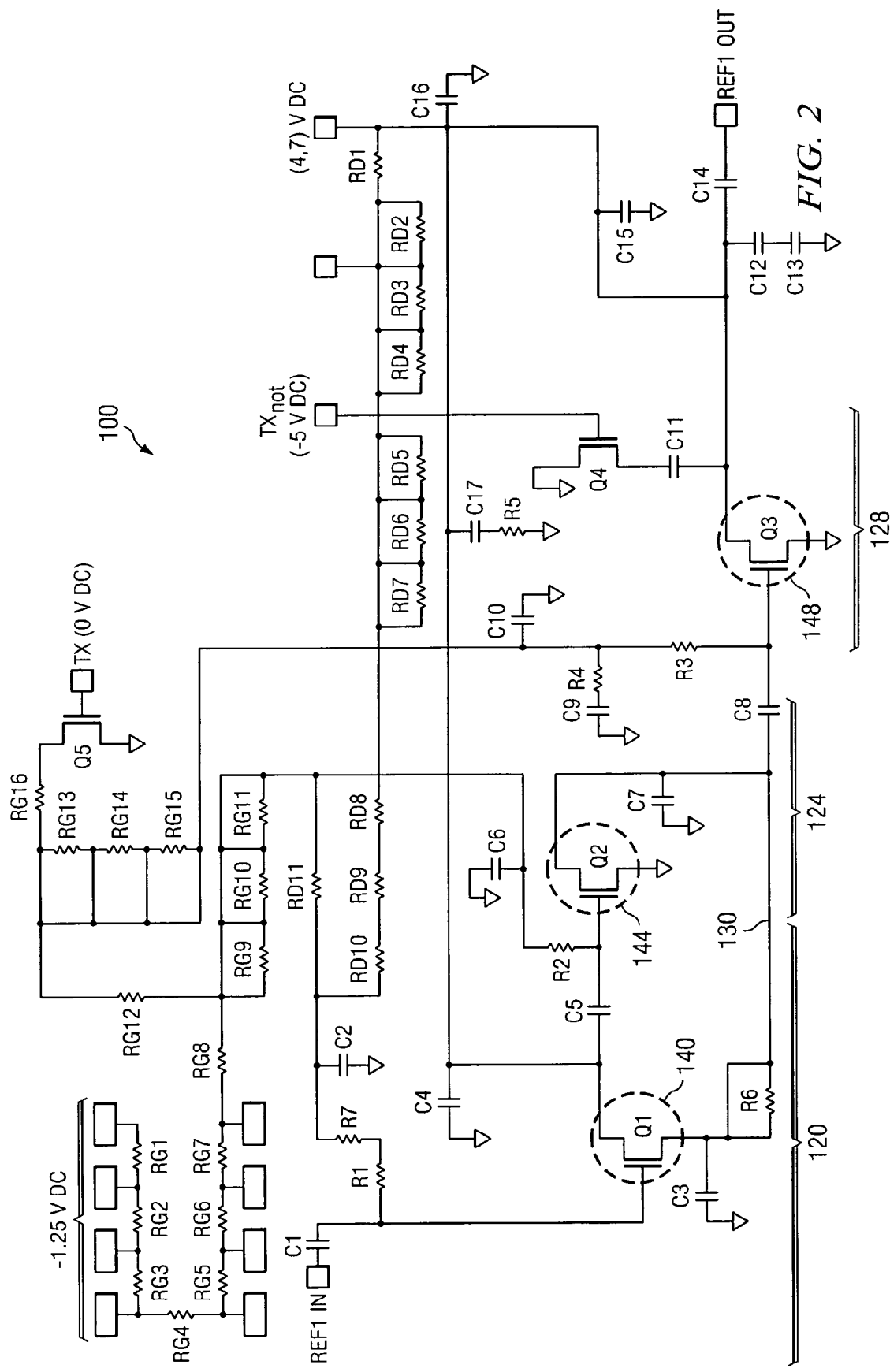
FIG. 2 is a circuit diagram of an example power amplifier of the embodiment of FIG. 1.

Embodiments of the present invention and its advantages are best understood by referring to FIGS. 1 through 3 of the drawings, like numerals being used for like and corresponding parts of the various drawings.

FIG. 1 is a circuit diagram of one embodiment of a power amplifier 10 that may be used to amplify a signal. In general, current may be shared between the driver stages of amplifier 10. The output power of each stage may be scaled to control power consumption by the driver stages. The output power scaling may improve the power added efficiency of the power amplifier.

According to the illustrated embodiment, amplifier 10 is coupled to integrated circuits 20 as shown. Amplifier 10 may receive a signal, amplify the signal, and transmit the amplified signal. An integrated circuit may refer to a circuit comprising a semiconductor material, for example, silicon. The components and connections of the circuit may be formed by processing areas of the semiconductor material. Amplifier 10, however, may be coupled to any suitable circuits. For example, amplifier 10 may be coupled to hybrid circuits. The semiconductor active device may be placed on a secondary material used to route bias and provide matching.

Amplifier 10 includes a resistor 30, terminals 34, and stages 38 coupled as shown. Amplifier 10 amplifies a received signal, and may have any suitable power amplifier gain. For example, amplifier 10 may have a power amplifier gain of less than 40 decibels, such as less than 30 or 20 decibels. Amplifier 10 may have any suitable input power and output power. For example, amplifier 10 may have an input power of approximately −30 dBm to +15 dBm, an output power of approximately 0 dBm to +30 dBm.

Voltages may be applied to terminals 34. A terminal may refer to a point of a device at which a voltage is applied. A gate voltage $V_g$ may be applied to terminal 34b, and a drain voltage $V_d$ may be applied to terminal 34a. Gate voltage $V_g$ may be approximately −0.1 to −0.7 volts (V), such as approximately −0.5 V, and drain voltage $V_d$ may be approximately 2 to 8 V, such as approximately 7 V.

A stage may refer to a stage of an amplifier that processes a signal. Examples of stages include driver stages and output stages. A driver stage 38 supplies excitation to a next driver stage 38. A driver stage may refer to an amplifier stage that supplies excitation, such as current, power, or voltage excitation, to a next stage, and may include a field effect transistor and matching circuits made of tuning elements such as lines, resistors, and capacitors between the transistors. According to the illustrated embodiment, driver stage 38a supplies excitation to driver stage 38b, and driver stage 38b provides excitation to driver stage 38c. Each stage 38 may have any suitable gain to yield any suitable power amplifier gain. For example, at microwave frequencies, a stage 38 may have a gain of approximately 10 decibels (dB) to yield a power amplifier gain of approximately 30 dB.

A driver stage 38 includes, at a minimum, a capacitor 42 and a transistor 46. A capacitor may refer to a passive electronic circuit component comprising metal electrodes separated by a dielectric. Capacitors 42 may have any suitable capacitance. For example, capacitor 42a may have the capacitance of approximately 0.1 to 10 picoFarads (pF), such as approximately 1.5 pF. Capacitor 42b may have a capacitance of approximately 0.1 to 10 pF, such as approximately 7 pF. Capacitor 42c may have a capacitance of approximately 0.1 to 10 pF, such as approximately 3 pF.

A transistor may refer to a semiconductor device that amplifies a signal. Transistor 46 may comprise any suitable transistor. According to one embodiment, transistor 46a may be approximately the same size as transistor 46b. For example, transistors 46a and 46b may be approximately 30 to 250 micrometers (μm), such as approximately 200 μm.

Transistors 46a and 46b may have other suitably similar features. The drain-source voltages $V_{DS}$ of transistors 46a and 46b may be approximately 1 to 6 V. For example, transistor 46a may have a drain-source voltage $V_{DS}$ of approximately 3.1 V, and transistor 46b may have a drain-source voltage $V_{DS}$ of approximately 3.9 V. The peak currents $I_P$ of transistors 46a and 46b may be approximately 35 to 40 milliamps (mA). For example, the peak currents $I_P$ may be approximately 38 mA.

Transistors 46a and 46b may also have any suitable load-target resistance ($R_P$), based on the transistor size, applied voltage, and power required to drive following amplifier stages. For example, transistor 46a may have a resistance $R_P$ of approximately 5 to 40 ohms-millimeters (Ω-mm), such as approximately 8 Ω-mm, and transistor 46b may have a resistance of approximately 5 to 40 Ω-mm, such as approximately 18 Ω-mm. Based on the load-target and the applied voltage, the power output $P_{out}$ of transistors 46a and 46b may be approximately −20 to 25 dBm (decibels relative to one milliwatt). For example, transistor 46a may have an output power capacity of approximately 10 dBm, and transistor 46b may have an output power capacity of approximately 18 dBm. The DC power consumed by transistors 46a and 46b is calculated from the total voltage $V_d$ across the transistors and the equal-current flowing through the transistors. The values may be, for example, 7 V and 15 mA, with a corresponding DC power consumption of 105 mW. The DC power consumption may be less than 15 percent of the power capability of the output device.

Transistor 46c may be larger than transistors 46a and 46b. According to one embodiment, transistor 46c may be approximately 400 to 600 μm, for example, approximately 450 or 550 μm. Transistor 46c may have a drain-source voltage $V_{DS}$ of approximately 3 to 10 V, such as approximately 7 V. The peak current $I_P$ may be approximately 70 to 1000 mA, such as approximately 78 mA. The load-target resistance $R_P$ may be approximately 30 to 40 Ω-mm, such as approximately 38 Ω-mm. The output power may be approximately 20 to 30 dBm, such as approximately 25 dBm. The DC power may be approximately 500 to 2000 mW, such as approximately 1000 mW.

Resistors 30 and 50 may be used to set the gate voltage on driver stage 38a. When current sharing, the gate voltage of first driver stage 38a is positive and may be used to adjust the voltage split. For example, if the nominal gate-to-source voltage for operating the transistor is −0.4 V, then to place ⅓ of the voltage on driver stage 38a, the voltage set by resistors 30 and 50 is $V_d/3-0.4$ V.

According to one embodiment, stages 38 of amplifier 10 may share a current. For example, stage 38a and 38b may share a current through a current sharing coupling 52. Current sharing coupling 52 may comprise any suitable connection operable to conduct current. The current sharing yields a substantially equivalent current between stages 38a and 38b. The current sharing may allow for the driver stages sharing the current to have transistors of approximately the same size. For example, transistor 46a may be approximately the same size as transistor 46b.

The power added efficiency (PAE) of amplifier 10 may be defined according to the following equation:

$$PAE = \frac{P_{out} - P_{in}}{DC_{os} + DC_{ds}} \quad (1)$$

where $P_{out}$ represents the output power of amplifier 10, $P_{in}$ represents the input power of amplifier 10, $DC_{os}$ represents the direct current (DC) power of the output stage, and $DC_{ds}$ represents the DC power of driver stages 38. Accordingly, an increase of the DC power $DC_{ds}$ of the driver stages 38 decreases the power added efficiency.

According to one embodiment, the DC power $DC_{ds}$ of driver stages 38 may be reduced by adjusting the size of the transistors and the voltage ratio between stages 38. A voltage ratio between a first stage and a second stage may refer to a ratio of the power applied to a first transistor of the first stage to the power applied a second transistor of the second stage. According to the embodiment, a lower voltage may be applied at stages 38a and 38b then at stage 38c. Gate voltages may be adjusted to set the voltage ratio to obtain a desired ratio between stages 38a and 38b and stage 38c in order to reduce the DC power of driver stages 38. The desired ratio may be approximately two-to-one, but may be as high as five-to-one. For example, voltage applied at stages 38a and 38b may be approximately 2 to 4 V, such as approximately 3.1 V for stage 38a and approximately 3.9 V for stage 38b. The voltage applied at stage 38c may be approximately 6 to 8 V volts, such as approximately 7.0 V.

Stage 38b may be operated under compression to allow for optimizing power added efficiency. According to one embodiment, the current sharing may be reversed to allow stage 38b to set the current, which may allow the current to increase under compression.

In operation, power amplifier 10 receives a signal. Driver stage 38a applies excitation to the received signal, which travels to driver stage 38b. Driver stage 38b applies excitation to the signal. Current may be shared between driver stages 38a and 38b. The output power of driver stages 38a and 38b may be scaled to control power consumption. The output power may be scaled by scaling the voltage, transistor size, resistance, or any combination of the preceding at each stage 38. The output power scaling may improve the power added efficiency of power amplifier 10. Driver stage 38c applies excitation to the signal and outputs the amplified signal.

Modifications, additions, or omissions may be made to amplifier 10 without departing from the scope of the invention. The components of amplifier 10 may be integrated or separated according to particular needs. Moreover, the operations of amplifier 10 may be performed by more, fewer, or other components. As used in this document, "each" refers to each member of a set or each member of a subset of a set.

FIG. 2 is a circuit diagram of an example power amplifier 100 of the embodiment of FIG. 1. Power amplifier 100 includes driver stages 120, 124, and 128. Driver stage 120 includes transistor 140, driver stage 124 includes transistor 144, and driver stage 128 includes transistor 148. Driver stages 120 and 124 are coupled by a current sharing coupling 130.

TABLES 1, 2, and 3 provide example values for the components of power amplifier 100. The values provided are examples only. The values of other example power amplifiers may be different from the values presented in the TABLES 1, 2, and 3.

TABLE 1 presents example values for the capacitors of power amplifier 100.

TABLE 1

| Capacitor | Capacitance (pF) |
|---|---|
| C1 | 1.50 |
| C2 | 14.90 |
| C3 | 24.80 |
| C4 | 13.00 |
| C5 | 7.00 |
| C6 | 6.04 |
| C7 | 0.70 |
| C8 | 3.00 |
| C9 | 0.35 |
| C10 | 6.04 |
| C11 | 0.95 |
| C12 | 0.31 |
| C13 | 0.31 |
| C14 | 1.20 |
| C15 | 14.90 |
| C16 | 24.80 |
| C17 | 2.00 |

TABLE 2 presents example values for the transistors of power amplifier 100.

TABLE 2

| Transistor | Type | Size (μm) |
|---|---|---|
| Q1 | 5 × 40 | 200 |
| Q2 | 5 × 40 | 200 |
| Q3 | 5 × 40 | 550 |
| Q4 (switch) | 1 × 35 | 35 |
| Q5 (switch) | 1 × 100 | 100 |

TABLES 3 presents example values for the resistors of power amplifier 100.

TABLE 3

| Resistor | Type: Tantalum (T) Mesa (M) | Resistance (Ω-mm) |
|---|---|---|
| R1 | 42 × 10.5 (T) | 24.0 |
| R2 | 90 × 9.90 (T) | 60.0 |
| R3 | 16 × 6.5 (T) | 15.0 |
| R4 | 16 × 9.6 (T) | 10.0 |
| R5 | 30 × 18.0 (T) | 10.0 |
| R6 | 20 × 6.7 (T) | 18.0 |
| RG1 | 42 × 29.0 (M) | 275.0 |
| RG2 | 42 × 39.9 (M) | 200.0 |
| RG3 | 42 × 53.2 (M) | 150.0 |
| RG4 | 10 × 28.4 (M) | 75.0 |
| RG5 | 22 × 50.9 (M) | 85.0 |
| RG6 | 22 × 54.1 (M) | 80.0 |
| RG7 | 22 × 57.7 (M) | 75.0 |
| RG8 | 20 × 22.7 (M) | 174.0 |
| RG9 | 14 × 26.0 (M) | 110.0 |
| RG10 | 14 × 24.9 (M) | 115.0 |

TABLE 3-continued

| Resistor | Type: Tantalum (T) Mesa (M) | Resistance (Ω-mm) |
|---|---|---|
| RG11 | 14 × 22.9 (M) | 125.0 |
| RG12 | 101 × 7.0 (T) | 86.0 |
| RG13 | 14 × 28.6 (M) | 100.0 |
| RG14 | 14 × 26.0 (M) | 110.0 |
| RG15 | 14 × 24.9 (M) | 115.0 |
| RG16 | 50 × 13.5 (M) | 698.1 |
| RD1 | 90 × 17.5 (M) | 960.0 |
| RD2 | 26 × 14.9 (M) | 340.0 |
| RD3 | 26 × 15.8 (M) | 320.0 |
| RD4 | 26 × 16.9 (M) | 300.0 |
| RD5 | 26 × 20.2 (M) | 250.0 |
| RD6 | 26 × 15.8 (M) | 320.0 |
| RD7 | 26 × 14.9 (M) | 340.0 |
| RD8 | 100 × 18.6 (M) | 1000.0 |
| RD9 | 250 × 26.4 (M) | 1742.0 |
| RD10 | 600 × 21.2 (M) | 600.0 |
| RD11 | 760 × 13.4 (M) | 10394.0 |

According to one embodiment of the invention, voltage applied to transistors 140 and 144 of driver stages 120 and 124, respectively, may be scaled to control power consumption by driver stages 120 and 124. The scaling may improve the power added efficiency of power amplifier 100.

Modifications, additions, or omissions may be made to amplifier 100 without departing from the scope of the invention. The components of amplifier 100 may be integrated or separated according to particular needs. Moreover, the operations of amplifier 100 may be performed by more, fewer, or other components.

FIG. 3 is a graph illustrating the driver performance over voltage of an example power amplifier of the embodiment of FIG. 1. The example power amplifier may be operating at room temperature with an input power of 0 dBm. According to the graph, a greater than 44% band average added efficiency may be achieved over an output power range of approximately 19 to 25 dBm.

Modifications, additions, or omissions may be made to the graph without departing from the scope of the invention.

Certain embodiments of the invention may provide one or more technical advantages. A technical advantage of one embodiment may be that current may be shared between driver stages of a power amplifier. The output power of each stage may be scaled to control power consumption by the driver stages. The output power scaling may improve the power added efficiency of the power amplifier.

While this disclosure has been described in terms of certain embodiments and generally associated methods, alterations and permutations of the embodiments and methods will be apparent to those skilled in the art. Accordingly, the above description of example embodiments does not constrain this disclosure. Other changes, substitutions, and alterations are also possible without departing from the spirit and scope of this disclosure, as defined by the following claims.

What is claimed is:

1. A power amplifier for amplifying a signal, comprising:
a plurality of amplifier stages of the power amplifier, an amplifier stage operable to process the signal received by the power amplifier, an amplifier stage comprising a transistor, at least one amplifier stage comprising a driver stage operable to supply excitation to a next stage to amplify the signal, the plurality of amplifier stages comprising:

a first amplifier stage having a first transistor, the first amplifier stage associated with a first output power; and a second amplifier stage having a second transistor, the second amplifier stage associated with a second output power and operable to operate under compression; and a current sharing coupling operable to couple the first amplifier stage and the second amplifier stage, the first amplifier stage and the second amplifier stage sharing a current through the current sharing coupling, the current sharing coupling operable to facilitate scaling of the first output power and the second output power.

2. The power amplifier of claim 1, further comprising:
a voltage source operable to apply voltage to the first transistor and the second transistor to facilitate scaling of the first output power and the second output power.

3. The power amplifier of claim 1, wherein:
the first transistor has a first size; and
the second transistor has a second size, the first size and the second size selected to facilitate scaling of the first output power and the second output power.

4. The power amplifier of claim 1, wherein:
the first amplifier stage has a first resistance; and
the second amplifier stage comprises a second load target having a second resistance, the first resistance and the second resistance selected to facilitate scaling of the first output power and the second output power.

5. A method for amplifying a signal, comprising:
receiving the signal at a plurality of amplifier stages of a power amplifier, an amplifier stage operable to process the signal, an amplifier stage comprising a transistor, at least one amplifier stage comprising a driver stage operable to supply excitation to a next stage to amplify the signal, the plurality of amplifier stages comprising:
a first amplifier stage having a first transistor, the first amplifier stage associated with a first output power; and
a second amplifier stage having a second transistor, the second amplifier stage associated with a second output power;
coupling the first amplifier stage and the second amplifier stage with a current sharing coupling;
operating the second amplifier stage under compression; and
sharing a current between the first amplifier stage and the second amplifier stage through the current sharing coupling, the current sharing coupling operable to facilitate scaling of the first output power and the second output power.

6. The method of claim 5, further comprising:
applying voltage to the first transistor and the second transistor to facilitate scaling of the first output power and the second output power.

7. The method of claim 5, wherein:
the first transistor has a first size; and
the second transistor has a second size, the first size and the second size selected to facilitate scaling of the first output power and the second output power.

8. The method of claim 5, wherein:
the first amplifier stage has a first resistance; and
the second amplifier stage comprises a second load target having a second resistance, the first resistance and the second resistance selected to facilitate scaling of the first output power and the second output power.

9. A power amplifier for amplifying a signal, comprising:
a plurality of amplifier stages of the power amplifier, an amplifier stage operable to process the signal received by the power amplifier, an amplifier stage comprising a transistor, at least one amplifier stage comprising a driver stage operable to supply excitation to a next stage to amplify the signal, the plurality of amplifier stages comprising:
a first amplifier stage having a first transistor, the first amplifier stage associated with a first output power;
a second amplifier stage having a second transistor, the second amplifier stage associated with a second output power and operable to operate under compression; and
a third amplifier stage having a third transistor, the third amplifier stage associated with a third output power; and
a current sharing coupling operable to couple the first amplifier stage and the second amplifier stage, the first amplifier stage and the second amplifier stage sharing a current through the current sharing coupling, the current sharing coupling operable to facilitate scaling of the first output power and the second output power.

10. The power amplifier of claim 9, further comprising:
a voltage source operable to apply voltage to the first transistor and the second transistor to facilitate scaling of the first output power and the second output power.

11. The power amplifier of claim 9, wherein:
the first transistor has a first size; and
the second transistor has a second size, the first size and the second size selected to facilitate scaling of the first output power and the second output power.

12. The power amplifier of claim 9, wherein:
the first amplifier stage has a first resistance; and
the second amplifier stage comprises a second load target having a second resistance, the first resistance and the second resistance selected to facilitate scaling of the first output power and the second output power.

13. A system for amplifying a signal, comprising:
means for receiving the signal at a plurality of amplifier stages of a power amplifier, an amplifier stage operable to process the signal, an amplifier stage comprising a transistor, at least one amplifier stage comprising a driver stage operable to supply excitation to a next stage to amplify the signal, the plurality of amplifier stages comprising:
a first amplifier stage having a first transistor, the first amplifier stage associated with a first output power; and
a second amplifier stage having a second transistor, the second amplifier stage associated with a second output power and operable to operate under compression;
means for coupling the first amplifier stage and the second amplifier stage with a current sharing coupling; and
means for sharing a current between the first amplifier stage and the second amplifier stage through the current sharing coupling, the current sharing coupling operable to facilitate scaling of the first output power and the second output power.

14. A power amplifier for amplifying a signal, comprising:
a plurality of amplifier stages of the power amplifier, an amplifier stage operable to process the signal received by the power amplifier, an amplifier stage comprising a transistor, at least one amplifier stage comprising a driver stage operable to supply excitation to a next stage to amplify the signal, the plurality of amplifier stages comprising:

a first amplifier stage having a first transistor, the first amplifier stage associated with a first output power, the first transistor having a first size, the first amplifier stage comprising a first load target having a first resistance; and a second amplifier stage having a second transistor, the second amplifier stage associated with a second output power, the second transistor having a second size, the first size and the second size selected to facilitate scaling of the first output power and the second output power, the second amplifier stage comprising a second load target having a second resistance, the first resistance and the second resistance selected to facilitate scaling of the first output power and the second output power, the second amplifier stage operable to operate under compression;

a current sharing coupling operable to couple the first amplifier stage and the second amplifier stage, the first amplifier stage and the second amplifier stage sharing a current through the current sharing coupling, the current sharing coupling operable to facilitate scaling of the first output power and the second output power; and a voltage source operable to apply voltage to the first transistor and the second transistor to facilitate scaling of the first output power and the second output power.

* * * * *

UNITED STATES PATENT AND TRADEMARK OFFICE
CERTIFICATE OF CORRECTION

PATENT NO.         : 7,256,654 B2
APPLICATION NO.  : 11/104777
DATED              : August 14, 2007
INVENTOR(S)        : Mikel J. White et al.

Page 1 of 1

It is certified that error appears in the above-identified patent and that said Letters Patent is hereby corrected as shown below:

Column 3, Line 67:

After "resistors 30 and 50 is" delete " $V_d\sqrt{3}-0.4V.$ " and insert -- $\dfrac{V_d}{3} - 0.4$ V. --.

Signed and Sealed this

Tenth Day of March, 2009

JOHN DOLL
*Acting Director of the United States Patent and Trademark Office*